(12) United States Patent
Roberts et al.

(10) Patent No.: US 11,804,413 B1
(45) Date of Patent: Oct. 31, 2023

(54) PRODUCT DESIGN FOR TEST TO ENABLE ELECTRICAL NON-DESTRUCTIVE TEST FOR MEASURING MULTI-CHIP INTERCONNECT DEFECTS

(71) Applicant: Intel Corporation, Santa Clara, CA (US)

(72) Inventors: Chad Roberts, Chandler, AZ (US);
George J. Morales, Gilbert, AZ (US);
Oscar Mendoza, Shrewsbury, MA (US); Kartik Ramanujachar, Gilbert, AZ (US); Michael S. Chun, Milpitas, CA (US); Anthony Zisko, Framingham, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/897,232

(22) Filed: Aug. 29, 2022

(51) Int. Cl.
*H01L 21/66* (2006.01)
*G01R 31/28* (2006.01)

(52) U.S. Cl.
CPC .......... *H01L 22/34* (2013.01); *G01R 31/2884* (2013.01)

(58) Field of Classification Search
CPC ............................ H01L 22/34; G01R 31/2884
USPC ...................................... 324/750.3, 537, 500
See application file for complete search history.

(56) References Cited

U.S. PATENT DOCUMENTS

| 9,129,816 | B2 * | 9/2015 | Chen | .................... H01L 23/4824 |
| 2012/0168752 | A1 * | 7/2012 | Wu | .......................... H01L 22/34 |
| | | | | 257/E23.179 |
| 2019/0311960 | A1 * | 10/2019 | Tan | ..................... G01R 31/2846 |

* cited by examiner

*Primary Examiner* — Giovanni Astacio-Oquendo
(74) *Attorney, Agent, or Firm* — VIERING, JENTSCHURA & PARTNER MBB

(57) ABSTRACT

A semiconductor stack, including a carrier and a semiconductor device arranged above the carrier; non-releasable interconnections electrically and mechanically connecting the semiconductor device and the carrier; a first contact on at least one of the carrier or the semiconductor device: a second contact on at least one of the carrier or the semiconductor device; an electrical connection structure electrically conductively coupling the first contact and the second contact with each other via at least one non-releasable interconnection of the non-releasable interconnections; and wherein the electrical connection structure comprises a plurality of test diode circuits integrated in at least one of the carrier and the semiconductor device, wherein each of the test diode circuits comprises one or more diodes.

20 Claims, 5 Drawing Sheets

US 11,804,413 B1

PRODUCT DESIGN FOR TEST TO ENABLE ELECTRICAL NON-DESTRUCTIVE TEST FOR MEASURING MULTI-CHIP INTERCONNECT DEFECTS

TECHNICAL FIELD

This disclosure generally relates to the field of methods for providing semiconductor devices.

BACKGROUND

In a semiconductor device, there may be specific regions in the bump fields that may be susceptible to defects, e.g. opens or shorts. These defects may arise due to excursions, process setup issues, and process drift.

In current semiconductor device manufacturing methods, when multiple dice are directly connected at a process like Thermo Compression bonding (TCB), inter-die connections cannot be easily verified. Two-dimensional (2D) or three-dimensional (3D) X-ray methods and/or physical cross-sectioning of the semiconductor device are used to analyze the result of the manufacturing processes. Thus, currently used processes require either a large amount of time per unit, e.g. manual X-Ray of joints taking hours per unit, or a large amount of time to fully build the unit before a subsequent socketed test step causing lot processing at the operation to be paused potentially for days while awaiting verification of multiple units. In the latter case, 1 to 2 weeks can elapse before feedback data is available which creates significant problems for immediate process feedback monitoring. Thus, the current procedure is a not real-time and is only feasible for setups at the current time.

Using build in self-test (BIST) requires an active socketing at a later operation. This typically takes around a week or more after completion of packaging process on units, delaying the availability of data on first level interconnect health. In addition, for new product introductions (NPI), the data from BIST may be significantly delayed as this method requires active content, further delaying feedback to the TCB process and the timeline for product release.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

The following detailed description refers to the accompanying drawings that show, by way of illustration, specific details and aspects in which the invention may be practiced.

The term "as an example" is used herein to mean "serving as an example, instance, or illustration". Any aspect or design described herein as "as an example" is not necessarily to be construed as preferred or advantageous over other aspects or designs.

Figure 1:
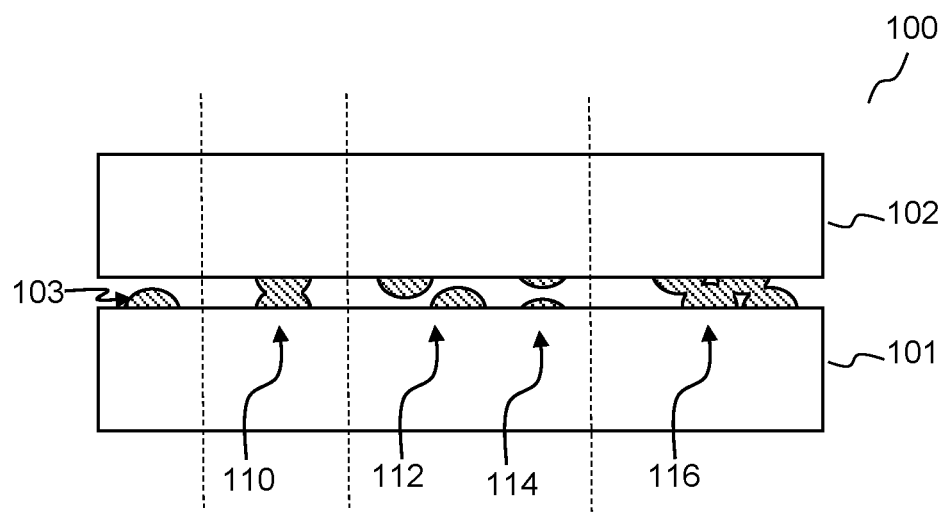
FIG. 1 illustrates a schematic diagram of a component stack having various interconnections.

FIG. 1 illustrates a schematic diagram of a semiconductor device having various interconnections. The semiconductor device 100 may include a first component 101 and a second component 102 connected to the first component 101 via a plurality of non-releasable interconnections 103 (also denoted as non-releasable interconnection structures). The semiconductor device 100 may be a device stack 100, a semiconductor stack 100, or a semiconductor device stack 100.

The first component 101 and the second component 102 may be substantially planar structures, e.g. a wafer, a die, a leadframe, a printed circuit board (PCB), a glass carrier, or similar. As an example, the first component may be a carrier 101 and the second component 102 may be a semiconductor device 102. Here, the carrier 101 may be a wafer, a PCB, a leadframe, or a die.

The non-releasable interconnections 103 may form an interconnection connection 110, e.g. a bump interconnection, wherein each of the first component 101 and the second component 102 includes a solder bump or adhesive bump 103 as non-releasable interconnection 103 that are coupled with each other, e.g. by thermal re-flowing the bumps 103, when they are in contact with each other.

However, when joining the first component 101 and the second component 102 together various connection failures may occur due to a skew and/or rotation of the first component 101 and the second component 102 relative to each other, or an insufficient bonding process, e.g. insufficient thermal heating, to form the interconnection 110. As an example, non-releasable interconnections 103 that are supposed to be connected remain open 112, 114 due to a lateral mismatch 112 or a vertical mismatch 114 of the non-releasable interconnections 103. As another example, non-releasable interconnections 103 that are supposed to be separated from each other may form a short 116 due to a lateral mismatch or a vertical mismatch of the non-releasable interconnections 103.

Previously, it has not been possible to rapidly detect shorts 112, 114 and opens 116 in joined components 101, 102 in a self-test. Thus, it was costly and time consuming to adjust the tools and machines used to join the components 101, 102 together and to form the non-releasable interconnection 110.

Analysis has shown that shorts 112, 114 and opens 116 are statistically more common in certain areas of the joined components 101, 102. However, the specific locations of shorts 112, 114 and opens 116 depend on the respective configuration and design of the first component 101 and the second component 102.

Figure 2A:
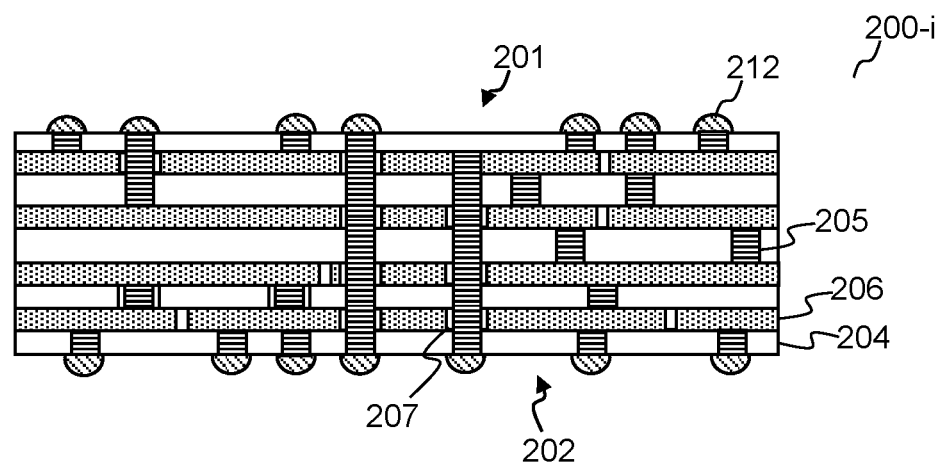
FIG. 2A illustrates a schematic cross-section of a component having a connection structure.
Figure 2B:
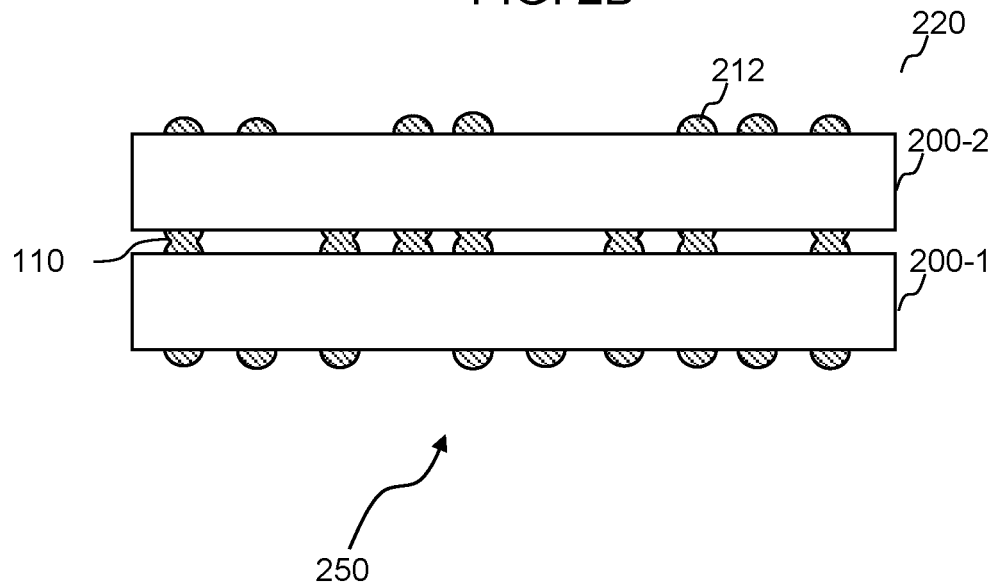
FIG. 2B illustrates a schematic cross-section of connected components forming a semiconductor device.

FIG. 2A illustrates a schematic cross-section of a component 200-$i$ having a connection structure to improve the adjustment process of the tools and machines used to form the semiconductor device illustrated in FIG. 2B.

Figure 2C:
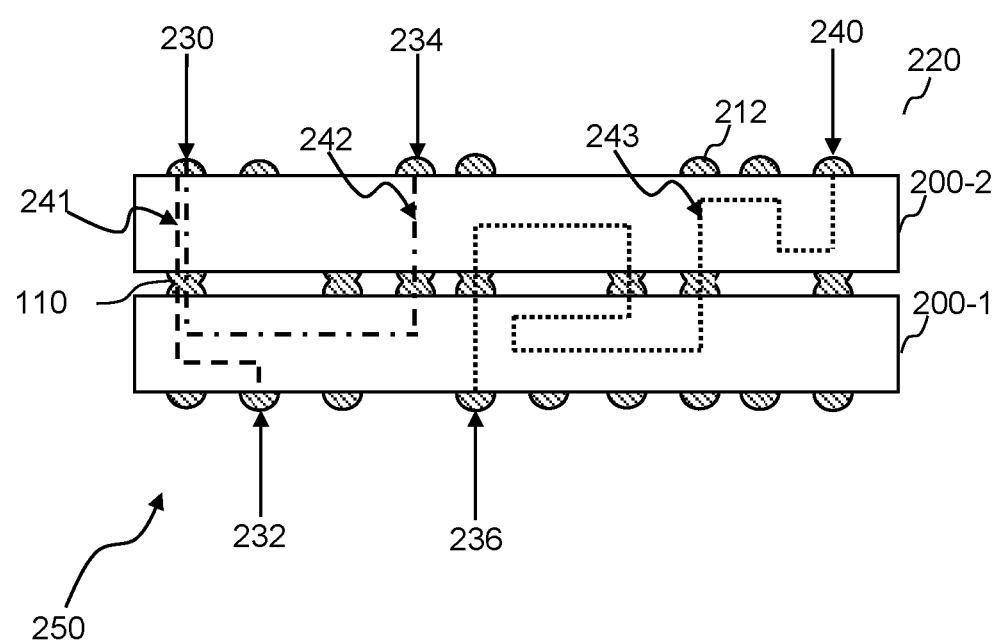
FIG. 2C illustrates a setup for an adjustment method in a method for a semiconductor device having at least a first component and a second component joined together.

In particular, the component 200-$i$ may be a die or printed circuit board having one or more metallization layers 206, and one or more interdielectric layers 204 separating adjacent metallization layers 206 from each other. The component 200-$i$ may have a first side 201 and a second side 202. The component 200-$i$ may have a functional area, e.g. a process or logic region, having an application specific integrated circuit for example (not shown in FIG. 2A). FIG. 2A illustrates a connection structure that is co-located in the component 200-$i$ in addition to the functional area. In other words, the functional area may be designed to provide space for the connection structure allowing to test or characterize predetermined areas of the component 200-*i* regarding shorts and opens in the semiconductor device 220 illustrated in FIG. 2B. The connection structure may be used for measurements to test electrical characteristics of various current paths corresponding to the predetermined areas of the component 200-*i*, as illustrated in FIG. 2C. A current path may be route or trace along a connection structure. The information gathered from the measurements, e.g. one or more current-voltage (IV) measurements at a first and second accessible contact of the semiconductor device 220, may be used to locate defects and identify misalignments of tools and machines used to produce the semiconductor device 220 in FIG. 2B.

As illustrated in FIG. 2A, the connection structure may include non-releasable interconnections 212 that are formed on at least one side of the first side 201 and the second side 202. The non-releasable interconnections 212 may be bumps or pads, for example. At least some of the non-releasable interconnections 212 may be configured for external contacting, e.g. may be exposed on one of the first and second sides 201, 202. Hence, some of the non-releasable interconnections 212 may be used as contacts.

The connection structure may include one or more vertical interconnect accesses (VIA) 205 coupling one or more non-releasable interconnections 212 with one or more metallization layer 206.

Further, an insulation 207 may be formed between a VIA 205 and a metallization layer 206 to insulate a VIA from a respective metallization layer. A connection structure may include one or more VIA and one or more metallization layer. Hence, the connection structure may electrically conductively couple a first contact with to a second contact including at least one non-releasable interconnection 110 or non-releasable interconnection structure 212 as illustrated in FIG. 2B and FIG. 2C. The term non-releasable interconnection is used interchangeably with the term non-releasable interconnection structure.

The connection structure, e.g. each metallization layer, may further include one or more electrical component (s) of diodes, resistors, transistors, capacitors and/or coils coupled to the non-releasable interconnection 212 by the VIA(s) 205 and the metallization layer(s) 206. The electrical component(s) may be formed in or using one or more of the metallization layer(s) 206 of the component 200-*i*.

The connection structure provides one or more current paths, e.g. routes, through or in (e.g. integrated in or embedded in) the component 200-*i* to test electrical properties of the component 200-*i*. As an example, a first non-releasable interconnection may be coupled to a second non-releasable interconnection through one or more VIAs 205 and one or more metallization layers, as illustrated in FIG. 2A. However, FIG. 2A only shows an illustrative example of internal connections of the non-releasable interconnections 212. The internal connection may be specific to the design and layout of the respective component 200-*i*. As an example, the connection structure may be formed to test the electrical properties of regions of the component 200-*i* that have previously been identified as being susceptible for shorts and opens (see FIG. 1).

The semiconductor device to be formed by the adjusted method using the connection structure may be formed without the connection structure. In other words, purpose of the components 200-*i* having the connection structure may be solely to adjust the tools and machines used for manufacturing the semiconductor device 220 having the components 200-*i* but without connection structure. However, the semiconductor device 220 can include some part or all of the connection structure in the final product.

FIG. 2B illustrates a schematic cross-section of interconnected components, e.g. a carrier and a semiconductor device, forming a semiconductor device 220, e.g. a semiconductor stack. The semiconductor device 220 may include two or more of the components 200-*i*, e.g. 200-1, 200-2, . . . ,200-N (with N being an integer), each having a connection structure as described in FIG. 2A even though FIG. 2B only illustrates a first component 200-1 and a second component 200-2. Illustratively, the semiconductor device 220 may include a stack having a plurality (N) of components 200-N. The components 200-1, 200-2 may be identical or different to each other.

The components 200-1, 200-2 are coupled via non-releasable interconnects 110 with each other. The semiconductor device 220 may be used to characterize the process including the adjustment of tools, machines, and process parameters for joining (e.g. bonding) the first component 200-1 and the second component 200-2 (and optionally more) together. The semiconductor device 220 formed after adjustment of the process parameter(s) can be formed free of connection structure in the components 200-*i*. can include the connection structure, or can include a portion of the connection structure.

FIG. 2C illustrates a setup for an adjustment method in a method of forming a semiconductor device having at least a first component 200-1 and a second component 200-2 joined together. The illustrated components 200-1, 200-2 and the semiconductor device 220 may be configured as described above.

In the adjustment method, various current paths may be characterized subsequently. FIG. 2C illustrates a first current path 241, a second current path 242, and a third current path 243. However, this is only an illustration, and the number of current paths depends on the characteristics of the semiconductor device, e.g. the statistical number and position of opens and shorts (see FIG. 1). As an example, there may be more or less current paths, and some or all of the current paths could be characterized in parallel. Hence, the current paths illustrated in FIG. 2C are merely meant to represent different kinds of current path courses (e.g. current routes) that may be used in the characterizing a joining process in the semiconductor device manufacturing process. A voltage or voltage sweep applied to the connection structure or a sub-section thereof may select of one of the current paths, for example.

As an example, a first current path 241 leads from a first contact 230 on one side of the component stack 250 directly to a second contact 232 on an opposite side of the component stack 250 through the first component 200-1 and the second component 200-2 joined together via non-releasable interconnections 110.

As another example, a second current path 242 leads from a first contact 230 that may be the same as in the first current path 241 (or a different one), through a non-releasable interconnection 110 to a third contact 234 on the same side of the component stack 250, e.g. through the first component 200-1 and the second component 200-2 joined together via non-releasable interconnections 110.

As another example, a third current path 243 leads from a fourth contact 236 on one side of the component stack 250 in loops one or more times through the first component 200-1, the second component 200-2 and/or non-releasable interconnections to a fifth contact 240 that may be on the same side of the component stack 250 or on an opposite side of the component stack 250 (illustrated).

The current paths 241, 242, 243 may include various electrical component(s) of diodes, resistors, transistors, capacitors and/or coils, and numbers thereof. The current paths 241, 242, 243 may be characterized by applying voltage or a voltage sweep to the respective contact or electrical components, and measuring a current-voltage curve using the respective contacts. A current-voltage (IV)-curve may be measured to characterize the respective current path 241, 242, 243 or sub-circuit thereof. Illustratively, each of the non-releasable interconnections of the component stack may be contacted at the same time, and the current paths or sub-circuits thereof may be characterized subsequently by applying predetermined voltages or voltage sweeps to characterize different sections of the component stack 250 subsequently or in parallel.

Figure 3:
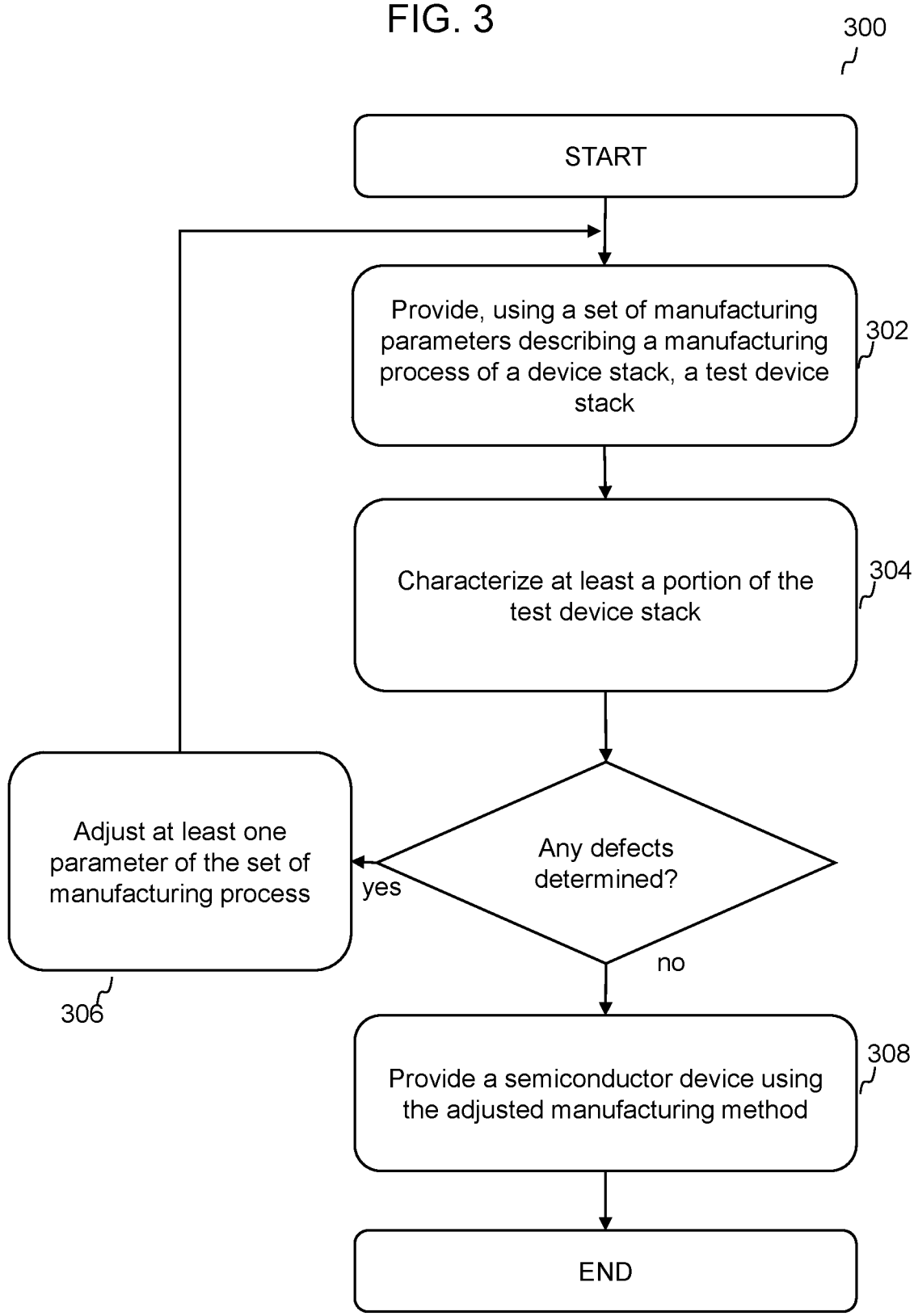
FIG. 3 illustrates a flow diagram of a method for manufacturing a semiconductor device.

FIG. 3 illustrates a flow diagram of a method 300 of providing a semiconductor device. The method includes providing 302, using a set of manufacturing parameters describing a manufacturing process of a device stack, a test device stack. The test device stack includes: a carrier and a semiconductor device arranged above the carrier; non-releasable interconnections electrically and mechanically connecting the semiconductor device and the carrier; a first contact on at least one of the carrier or the semiconductor device: and a second contact on at least one of the carrier or the semiconductor device, an electrical connection structure electrically conductively coupling the first contact and the second contact with each other via at least one non-releasable interconnection of the non-releasable interconnections. The electrical connection structure includes a plurality of test diode circuits integrated in at least one of the carrier and the semiconductor device, wherein each of the test diode circuits includes one or more diodes.

The method 300 includes characterizing 304 at least a portion of the test device stack using the first contact, the second contact, and the test diode circuits;

The method 300 includes adjusting 306 at least one parameter.

In other words, the method 300 may include providing 302, using a set method, a component stack having at least a first component and a second component joined together. The component stack includes a connection structure configured to characterize predetermined areas of the component stack. The predetermined areas may be susceptible to opens and shorts, as described in FIG. 1. The set method may include various tools, machines, process protocols, and parameters used to manufacture the component stack.

The method 300 may include a characterizing 304 of the predetermined areas of the component stack using the connection structure of the component stack, as described in FIG. 2A to FIG. 2C.

In case one or more defects, e.g. shorts or opens, have been determined, the method 300 may include adjusting 306 at least one parameter of the method based on the characterization results of the predetermined areas. A new component stack may be provided using the adjusted parameter.

In case no defect has been determined or a solution for the determined defects is known, the method 300 may include providing 308 a semiconductor device using the adjusted method. The semiconductor device includes a first device component corresponding to the first component, and a second device component corresponding to the second component.

Thus, the method 300 includes a connection structure that is a design for test (DFT) enabling a detection of solder joint first level interconnect (FLI) connection issues, e.g. shorts and opens as described above, for example. The DFT provides a built-in self-test (BIST) at an active electrical test socket, after the assembly and packaging process completes.

As an example, the component stack may include routing traces around the edges of a die, e.g. as in edge defect monitor (EDM). Multiple traces are routed back and forth through non-releasable interconnections bumps in and out of the components of the component stack being bonded in specific locations that are susceptible to opens or short failures. The contact, e.g. positive and ground end points, of each connection structure may be routed out of the package, e.g. via solder bumps, e.g. controlled collapse chip connection (C4), to the package pads or land grid array (LGA). This way, a measurement method is provided that can be used with a simple direct current (DC) source or measurement test instrument with no clock signals required.

Illustratively, the DFT serves as a live process monitor allowing feedback on many components of the component stack within minutes right at the TCB bonding process step, via a simple Flying prober situated near the TCB module area. This allows fast feedback for product setup, and monitoring of TCB related opens and shorts, to catch excursions or tool drift, before they become significant issues.

Alternatively, or in addition, the DFT works at a later test where other BIST content currently resides, while only requiring minimal silicon real estate, and the DFT leverages the EDM solution learnings.

Illustratively, the connection structure (DFT) features may appear as chains of bumps (also denoted as micro bump chain or uBC), with alternate routings in upper and lower components to the next connected bump, e.g. with diodes attached internally on one of the component. The end points of the uBC may be routed to testable pads, e.g. ball grid arrays (BGA) or land grid array (LGA), on the package via C4 bumps. The end points of each trace may be routed out to the package pads, BGA's or LGA's. This way, it is possible to probe all combinations of pads, and measure the resistance around the chains. To detect defects, the bumps may be connected for DC test techniques using within component traces, e.g. die traces, and bridge loopback nets alternately in each of the component being bonded. The uBC can be specifically routed in specific core and embedded multi-die interconnect bridge (EMIB) or similar die areas for detection of shorts and opens, based on defect location data.

Figure 4:
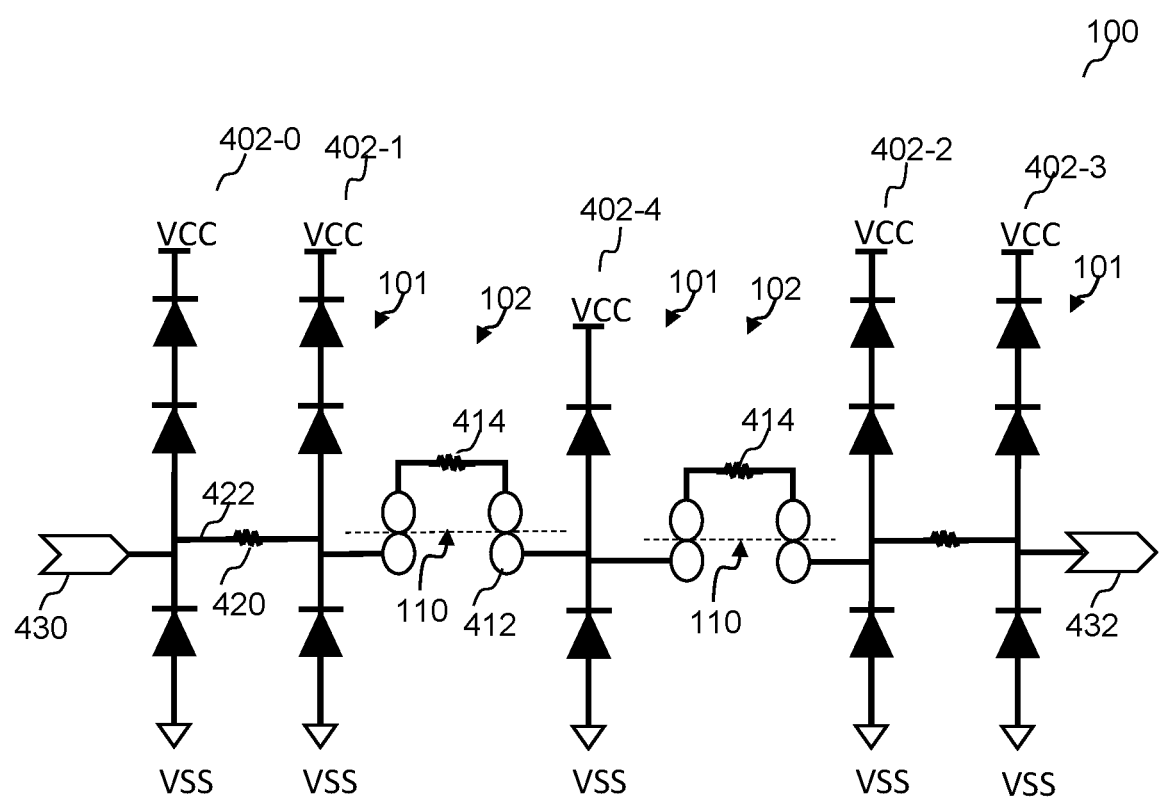
FIG. 4 illustrates a circuit diagram of a component stack having a connection structure.

FIG. 4 illustrates a circuit diagram of a component stack 100 having a first component 101 coupled to a second component 102 via a connection structure 110. The connection structure 110 includes a single bump chain routing, where first routing traces 422 may be in the first component 101, e.g. in the core or compute die, and second routing traces 414 may be in the second component 102, e.g. in an embedded multi-die interconnect bridge (EMIB) bridge die, by non-releasable interconnections 412 at the joined/bonded interface between the two components 101, 102.

There may be an electrostatic discharge (ESD) diode circuit (not illustrated) at the package-in location 430 (also denoted as input or first bump 430) and the package-out location 436 (also denoted as output or second bump 432), respectively.

The electrical connection structure may include test circuits, e.g. test diode circuits 402-0, . . . , 402-4. The test circuits 402-0, . . . , 402-4 may be formed in the first component 101 (illustrated in FIG. 4) and/or in the second component 102.

The test circuits 402-0, . . . , 402-4 can include different numbers of diodes. Individual test circuit may thus be denoted as test diode circuits. The test circuits 402-0, . . . , 402-4 may be sub-circuits of a current path or may be current paths as described above (see FIG. 2C). For example, the test circuits may include test circuits 402-4 of two stacked diodes, and test circuits 402-0, 402-3 of three stacked diodes, as illustrated in FIG. 4. The diodes of the test circuits are arranged in series, wherein the cathode of one diode is coupled to a voltage source VCC. The voltage source may be coupled to a redistribution layer, a metallization, or an exposed interconnection of at least one of the first component 101 and second component 102. The voltage of the voltage source VCC may be adjusted for each of the test circuits 402-0, . . . , 402-4 subsequently for narrowing the region in which part of the bump chain routing failures, e.g. opens and shorts of at least one of the non-releasable interconnections 412, occur. Illustratively, by adjusting the voltage of the test circuits 402-0, . . . , 402-4, the current path through the component (see FIG. 2A) and the component stack (see FIG. 2C) can be adjusted. This way, by identifying the location of the routing failures, parameters of the manufacturing process can be adjusted accordingly. Further illustrated are resistances 420 of the metallization layers, and resistances 414 of silicon bridges.

As an example, the test circuits 402-0, . . . , 402-4 may be coupled to a first voltage source VSS and a second voltage source VCC respectively. The voltage of the first voltage source VSS and the voltage of the second voltage source VCC can be adjusted. The first voltage source VSS and the second voltage source VCC may be coupled to the test circuits 402-0, 402-1, 402-2, 402-3, 402-4 via a redistribution layer, a metallization layer, or an exposed interconnection structure of at least one of the first component 101 and the second component 102. The voltage of the voltage sources VSS, VCC may be adjusted for each of the test circuits 402-0, . . . , 402-4 subsequently for narrowing the region in which part of the bump chain routing failures, e.g. opens and shorts of at least one of the non-releasable interconnections 412, occur.

The IV-curves traced between the input contact 430 and the output contact 432 adjusting the voltage of the test circuits 402-0, . . . , 402-4 have characteristic features for component stacks 100 that are free of defects and component stacks 100 having defects. Opens and shorts based on their location within the test circuits will produce distinct IV-curves, enabling quick identification of defective semiconductor devices having the connection structure.

Illustratively, the EDM-like routing creating micro-bump chains can be flexible and can be configured to minimize C4 bump usage by having multiple 'Chain In' (positive/high side) inputs 430 utilizing the same 'Chain Out' 432. Multiple chains can also be used per EMIB die, and/or individual chains could potentially cover multiple dice, depending on specific design requirements and implementation, and on desired detection and measurement capabilities. This simplified DFT enables real-time process setup checks and simplified process feedback. Alternatively, or in addition, the DFT creates capability for product assembly monitoring of FLI joint health using a simple Flying Probe Tester right at TCB during active production runs.

EXAMPLES

The examples set forth herein are illustrative and not exhaustive.

Example 1 is a semiconductor stack, including a carrier and a semiconductor device arranged above the carrier; non-releasable interconnections electrically and mechanically connecting the semiconductor device and the carrier; a first contact on at least one of the carrier or the semiconductor device; a second contact on at least one of the carrier or the semiconductor device; an electrical connection structure electrically conductively coupling the first contact and the second contact with each other via at least one non-releasable interconnection of the non-releasable interconnections; and wherein the electrical connection structure includes a plurality of test diode circuits integrated in at least one of the carrier and the semiconductor device, wherein each of the test diode circuits includes one or more diodes.

In Example 2, the subject matter of Example 1 can optionally include that a non-releasable interconnection is arranged between a first test diode circuit and a second test diode circuit of the plurality of test diode circuits.

In Example 3, the subject matter of Example 1 or 2 can optionally include that at least a subset of the test diode circuits includes a non-releasable interconnection.

In Example 4, the subject matter of any one of Examples 1 to 3 can optionally include that at least in a subset of the test diode circuits a cathode of at least one diode is coupled to a voltage source.

In Example 5, the subject matter of any of Examples 1 to 4 can optionally include that the test circuits are test diode circuits each including a plurality of diodes coupled in series.

In Example 6, the subject matter of any of Examples 1 to 5 can optionally include that each of the carrier and the semiconductor device includes a substrate, wherein the electrical connection structure is embedded at least in part in the substrates of the carrier and the semiconductor device.

In Example 7, the subject matter of any of Examples 1 to 6 can optionally include that the connection structure includes at least one of one or more metallization layers, and one or more VIAs.

In Example 8, the subject matter of any of Examples 1 to 7 can optionally include that the electrical connection structure includes a plurality of electrical connection structures coupled to the first contact and the second contact.

In Example 9, the subject matter of any of Examples 1 to 8 can optionally include that the carrier is at least one of a printed circuit board, a wafer, a die, and a leadframe.

In Example 10, the subject matter of any of Examples 1 to 9 can optionally include that the semiconductor device is at least one of a wafer and a die.

In Example 11, the subject matter of any one of Examples 1 to 10 can optionally include that the first contact is formed on a surface of the carrier and the second contact is formed on a surface of the semiconductor device.

In Example 12, the subject matter of any one of Examples 1 to 10 can optionally include that the first contact and the second contact are formed on a surface of the carrier.

In Example 13, the subject matter of any one of Examples 1 to 12 can optionally include that the non-releasable interconnections include at least one of a plurality of C4 bumps, a ball grid array, a land grid array.

In Example 14, the subject matter of any one of Examples 1 to 13 can optionally include that at least one of the first contact and the second contact includes at least one of a C4 bump, a ball grid array, a land grid array.

In Example 15, the subject matter of any one of Examples 1 to 14 can optionally include that connection structure includes a plurality electrical components including on or more of diodes, resistors, transistors, capacitors and/or coils and numbers thereof.

Example 16 is a semiconductor stack, including: a carrier and a semiconductor device arranged above the carrier; non-releasable interconnections electrically and mechanically connecting the semiconductor device and the carrier; a first contact on at least one of the carrier or the semiconductor device; a second contact on at least one of the carrier or the semiconductor device; wherein the first contact and the second contact are electrically conductively coupled with each other via at least one non-releasable interconnection of the non-releasable interconnections; and wherein each of the carrier and the semiconductor device includes a functional area electrically isolated from the first contact, the second contact, and the non-releasable interconnection.

In Example 17, the subject matter of Example16 can optionally further include that an electrical connection structure electrically conductively coupling the first contact and the second contact with each other via at least one non-releasable interconnection of the non-releasable interconnections.

In Example 18, the subject matter of Example 16 or 17 can optionally include that each of the carrier and the semiconductor device includes a substrate, wherein the electrical connection structure is embedded at least in part in the substrates of the carrier and the semiconductor device.

In Example 19, the subject matter of Example 18 can optionally include that the functional area includes an estate on or in the substrates of the carrier and the semiconductor device, and wherein the electrical connection structure is integrated in the estate of the functional area of at least one of the carrier and the semiconductor device. The estate may be the footprint or space a functional area requires on the substrate. The functional area when designing the semiconductor stack may be arranged as a ready-made floor plan from a library in a computer program-product on the substrate. Here, the electrical connection structure is at least in part embedded in the floor plan of the functional area.

In Example 20, the subject matter of Example 18 can optionally include that the functional area includes an estate on or in the substrates of the carrier and the semiconductor device, and wherein the electrical connection structure is arranged adjacent to the estate of the functional area of at least one of the carrier and the semiconductor device. Here, the electrical connection structure is arranged as a stand-alone floor plan adjacent to the floor plan of the functional area. The floor plan of the electrical connection structure can be placed before or after the floor plan of the functional area is arranged on the substrate.

In Example 21, the subject matter of any one of Examples 16 to 20 can optionally include that the functional area is an application specific integrated circuit.

In Example 22, the subject matter of any one of Examples 16 to 21 can optionally include that the electrical connection structure includes at least one of one or more metallization layers, one or more VIAs, and a plurality of electrical connection structures coupled to the first contact and the second contact.

In Example 23, the subject matter of any one of Examples 16 to 22 can optionally include that the carrier is at least one of a printed circuit board, a wafer, a die, and a leadframe.

In Example 24, the subject matter of any one of Examples 16 to 23 can optionally include that the semiconductor device is at least one of a wafer and a die.

In Example 25, the subject matter of any one of Examples 16 to 24 can optionally include that the first contact and the second contact are formed on a surface of the first component.

In Example 26, the subject matter of any one of Examples 16 to 24 can optionally include that the non-releasable interconnections are at least one of plurality of C4 bumps, a ball grid array, or a land grid array.

In Example 27, the subject matter of any one of Examples 16 to 26 can optionally include that at least one of the first contact and the second contact includes at least one of a C4 bump, a ball grid array, or a land grid array.

Example 28 is a method, including: providing, using a set of manufacturing parameters describing a manufacturing process of a device stack, a test device stack. The test device stack includes: a carrier and a semiconductor device arranged above the carrier; non-releasable interconnections electrically and mechanically connecting the semiconductor device and the carrier; a first contact on at least one of the carrier or the semiconductor device; and a second contact on at least one of the carrier or the semiconductor device, an electrical connection structure electrically conductively coupling the first contact and the second contact with each other via at least one non-releasable interconnection of the non-releasable interconnections; and wherein the electrical connection structure includes a plurality of test diode circuits integrated in at least one of the carrier and the semiconductor device, wherein each of the test diode circuits includes one or more diodes. The test device stack can be further configured according to any one of Example 1 to 27. The method includes characterizing at least a portion of the test device stack using the first contact, the second contact, and the test diode circuits; and adjusting at least one parameter of the set of manufacturing parameters based on the characterization result.

In Example 29, the subject matter of Example 28 can optionally include that characterizing at least a portion of the test device stack includes applying a predetermined voltage or voltage sweep to at least one of the test diode circuits, and measuring a current voltage curve using the first contact and the second contact.

In Example 30, the subject matter of any one of Examples 28 to 29 can optionally include that the adjusted parameter is at least one of a bonding temperature value, a bonding time, and a bonding pressure.

In Example 31, the subject matter of any one of Examples 28 to 30 can optionally include providing a semiconductor device using the adjusted manufacturing parameters.

In Example 32, the subject matter of Example 31 can optionally include that the semiconductor device is provided free of electrical connection structure.

In Example 33, the subject matter of Example 31 can optionally include that the semiconductor device includes at least a part of the electrical connection structure.

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor stack, comprising:
   a carrier and a semiconductor device arranged above the carrier;

non-releasable interconnections electrically and mechanically connecting the semiconductor device and the carrier;

a first contact on at least one of the carrier or the semiconductor device;

a second contact on at least one of the carrier or the semiconductor device;

an electrical connection structure electrically conductively coupling the first contact and the second contact with each other via at least one non-releasable interconnection of the non-releasable interconnections; and wherein the electrical connection structure comprises a plurality of test diode circuits integrated in at least one of the carrier and the semiconductor device, wherein each of the test diode circuits comprises one or more diodes.

2. The semiconductor stack of claim 1, wherein a non-releasable interconnection is arranged between a first test diode circuit and a second test diode circuit of the plurality of test diode circuits.

3. The semiconductor device of claim 1, wherein at least a subset of the test diode circuits comprises a non-releasable interconnection.

4. The semiconductor stack of claim 1, wherein each of the carrier and the semiconductor device includes a substrate, wherein the electrical connection structure is embedded at least in part in the substrates of the carrier and the semiconductor device.

5. The semiconductor stack of claim 1, wherein the carrier is at least one of a printed circuit board, a wafer, a die, and a leadframe, and wherein the semiconductor device is at least one of a wafer and a die.

6. A semiconductor stack, comprising:
a carrier and a semiconductor device arranged above the carrier;
non-releasable interconnections electrically and mechanically connecting the semiconductor device and the carrier;
a first contact on at least one of the carrier or the semiconductor device;
a second contact on at least one of the carrier or the semiconductor device;
wherein the first contact and the second contact are electrically conductively coupled with each other via at least one non-releasable interconnection of the non-releasable interconnections: and.
wherein each of the carrier and the semiconductor device comprises a functional area electrically isolated from the first contact, the second contact, and the non-releasable interconnection.

7. The semiconductor stack of claim 6, further comprising an electrical connection structure electrically conductively coupling the first contact and the second contact with each other via at least one non-releasable interconnection of the non-releasable interconnections.

8. The semiconductor stack of claim 6, wherein each of the carrier and the semiconductor device includes a substrate, wherein the electrical connection structure is embedded at least in part in the substrates of the carrier and the semiconductor device.

9. The semiconductor stack of claim 8, wherein the functional area comprises an estate on or in the substrates of the carrier and the semiconductor device, and wherein the electrical connection structure is integrated in the estate of the functional area of at least one of the carrier and the semiconductor device.

10. The semiconductor stack of claim 8, wherein the functional area comprises an estate on or in the substrates of the carrier and the semiconductor device, and wherein the electrical connection structure is arranged adjacent to the estate of the functional area of at least one of the carrier and the semiconductor device.

11. The semiconductor stack of claim 6, wherein the functional area is an application specific integrated circuit.

12. The semiconductor stack of claim 6, wherein the electrical connection structure comprises at least one of one or more metallization layers, one or more VIAs, and a plurality of electrical connection structures coupled to the first contact and the second contact.

13. The semiconductor stack of claim 6, wherein the carrier is at least one of a printed circuit board, a wafer, a die, and a leadframe.

14. The semiconductor stack of claim 6, wherein the semiconductor device is at least one of a wafer and a die.

15. A method, comprising:
providing, using a set of manufacturing parameters describing a manufacturing process of a device stack, a test device stack, wherein the test device stack comprises:
a carrier and a semiconductor device arranged above the carrier;
non-releasable interconnections electrically and mechanically connecting the semiconductor device and the carrier:
a first contact on at least one of the carrier or the semiconductor device; and
a second contact on at least one of the carrier or the semiconductor device, an electrical connection structure electrically conductively coupling the first contact and the second contact with each other via at least one non-releasable interconnection of the non-releasable interconnections; and wherein the electrical connection structure comprises a plurality of test diode circuits integrated in at least one of the carrier and the semiconductor device, wherein each of the test diode circuits comprises one or more diodes;
characterizing at least a portion of the test device stack using the first contact, the second contact, and the test diode circuits;
adjusting at least one parameter of the set of manufacturing parameters based on the characterization.

16. The method of claim 15, wherein characterizing at least a portion of the test device stack comprises applying a predetermined voltage or voltage sweep to at least one of the test diode circuits, and measuring a current voltage curve using the first contact and the second contact.

17. The method of claim 15, wherein the adjusted parameter is at least one of a bonding temperature value, a bonding time, and a bonding pressure.

18. The method of claim 15, further comprising:
providing a semiconductor device using the adjusted manufacturing parameters.

19. The method of claim 18, wherein the semiconductor device is provided free of electrical connection structure.

20. The method of claim 19, wherein the semiconductor device comprises at least a part of the electrical connection structure.

* * * * *